United States Patent [19]
Zhang et al.

[11] Patent Number: 5,893,752
[45] Date of Patent: Apr. 13, 1999

[54] PROCESS FOR FORMING A SEMICONDUCTOR DEVICE

[75] Inventors: Jiming Zhang, Austin; Dean J. Denning, Del Valle, both of Tex.

[73] Assignee: Motorola, Inc., Schaumburg, Ill.

[21] Appl. No.: 08/996,000

[22] Filed: Dec. 22, 1997

[51] Int. Cl.$^6$ .................................................. H01L 21/00
[52] U.S. Cl. ........................ 438/687; 438/687; 438/627; 438/628; 438/643
[58] Field of Search ................... 438/653, 627–28, 438/654, 656, 643, 644, 645, 648, 680, 681, 658, 687

[56] References Cited

U.S. PATENT DOCUMENTS

| | | | |
|---|---|---|---|
| 5,206,187 | 4/1993 | Doan et al. | 437/192 |
| 5,231,053 | 7/1993 | Bost et al. | 437/190 |
| 5,289,035 | 2/1994 | Bost et al. | 257/750 |
| 5,323,047 | 6/1994 | Nguyen | 257/384 |
| 5,391,517 | 2/1995 | Gelatos et al. | 438/643 |
| 5,420,072 | 5/1995 | Fiordalice et al. | 438/607 |
| 5,468,339 | 11/1995 | Gupta et al. | 216/67 |
| 5,614,437 | 3/1997 | Choudhury | 437/140 |
| 5,677,238 | 10/1997 | Gn et al. | 438/653 |
| 5,747,360 | 5/1998 | Nulman | 1/1 |

FOREIGN PATENT DOCUMENTS

| | | | |
|---|---|---|---|
| 0 163 830 A2 | 12/1985 | European Pat. Off. | H01L 23/52 |
| 0 673 063 A2 | 9/1995 | European Pat. Off. | H01L 21/768 |

OTHER PUBLICATIONS

Wolf et al. Silicon Processing for the VLSI Era vol. 2, pp. 273–276, 1990, no month.

Han Sin Lee et al., An Optimized Densification of the Filled Oxide for Quarter Micro Shallow Trench Isolation (STI), 1996 Symposium on VLSI Technology, Digest of Technical Papers, International Electron Devices Meeting, pp. 158–159 (1966).

Torres, Advanced copper Interconnections for silicon CMOS technologies, Applied Surface Science 91 (1995) pp. 112–123.

Wang, Barriers Against Copper Diffusion into Silicon and Drift Through Silicon Dioxide, MRS Bulletin/Aug. 1994, pp. 30–39.

Reid et al., Evaluation of amorphous (Mo, Ta W)—Si–N diffusion barriers for <Si>/Cu metallizations, Elsevier Sequoia (1993), pp. 319–324.

Wang et al., Diffusion barrier study on TaSi$^x$ and TaSi$_x$N$_y$, Elsevier Sequoia (1993) pp. 169–174.

Smolinsky et al., Material Properties of Spin–on Silicon Oxide (SOX) for Fully Recessed NMOS Field Isolation, J. Electrochem. Soc., vol. 137, No. 1, Jan. 1990, The Electrochemical Society, Inc., pp. 229–234.

Selective Oxidation of Titanium while forming Titanium Silicide at Polysilicon and Diffusions, IBM Technical Disclosure Bulletin vol. 27 No. 10A Mar. 1985.

Frisa et al.; U.S. appl. No. 8/804,589, filed Feb. 26, 1997.

Frisa et al.; U.S. appl. No. 08/887,654 filed Jul. 3, 1997.

*Primary Examiner*—Charles Bowers
*Assistant Examiner*—Thanh Nguyen
*Attorney, Agent, or Firm*—George R. Meyer

[57] ABSTRACT

A semiconductor device comprises a substrate (100), first conductive film (22 and 32) over the substrate (100), and a second conductive film (54 and 64) over the first conductive film (22 and 32). The first conductive film includes a refractory metal and nitrogen. The first conductive film has a first portion (22) that lies closer to the substrate and a second portion (32) that lies further from the substrate. The nitrogen percentage for the second portion (32) is lower than the nitrogen atomic percentage for the first portion (22). The second conductive film (54 and 64) includes mostly copper. The combination of portions (22 and 32) within the first conductive film provides a good diffusion barrier (first portion) and has good adhesion (second portion) with the second conductive film (54 and 64).

22 Claims, 5 Drawing Sheets

PROCESS FOR FORMING A SEMICONDUCTOR DEVICE

RELATED APPLICATIONS

This is related to U.S. patent application Ser. No. 08/804,589 filed Feb. 26, 1997, and Ser. No. 08/887,654 filed Jul. 3, 1997, both of which are assigned to the current assignee hereof.

FIELD OF THE INVENTION

This invention relates in general to semiconductor devices and processes for forming semiconductor devices, and more particularly, to semiconductor devices and processes for forming those devices having metal interconnects.

BACKGROUND OF THE INVENTION

Typically metalization schemes require barrier or adhesion films in order for a metal film to properly adhere to and make good contact resistance with underlying layers. A common metalization scheme for aluminum interconnects uses a combination of a titanium film followed by a titanium nitride film, over which, an aluminum or an aluminum alloy film is deposited. Aluminum suffers from several problems, such as its relative high resistance compared to copper and electromigration problems.

Attempts have been made to use tantalum and tantalum related compounds in forming interconnect structures. For example, either a pure tantalum film or a tantalum nitride film is used as a barrier/adhesion film for a copper interconnect. However, tantalum can be very difficult to remove using a polishing process, and tantalum nitride has adhesion problems with some types of copper films.

Other barrier/adhesion films could be used for the interconnect schemes. In one, a titanium film is deposited followed by a titanium nitride film that is followed by a titanium-rich titanium nitride film. Following the deposition of the titanium-rich titanium nitride film, an oxygen plasma is then used to convert that film to a titanium oxynitride compound. Unfortunately, titanium oxynitride can be too resistive. Although tantalum can be used in place of titanium in the oxynitride compound, the problems with the relatively high resistance is expected to continue to be a problem.

In another interconnecting scheme, an aluminum or aluminum alloy film can be capped with a titanium-rich titanium nitride compound followed by a stoichiometric titanium nitride compound. As previously discussed, copper does not adhere to titanium nitride very well. Even if tantalum is used to replace the titanium, the adhesion problem still exists with tantalum nitride.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

A semiconductor device comprises a substrate, first conductive film over the substrate, and a second conductive film over the first conductive film. The first conductive film includes a refractory metal and nitrogen. The first conductive film has a first portion that lies closer to the substrate and a second portion that lies further from the substrate. The nitrogen percentage for the second portion is lower than the nitrogen atomic percentage for the first portion. The second conductive film includes mostly copper. The combination of portions within the first conductive film provides a good diffusion barrier (first portion) and has good adhesion (second portion) with the second conductive film. The present invention is better understood after reading the embodiments described below.

Figure 1:
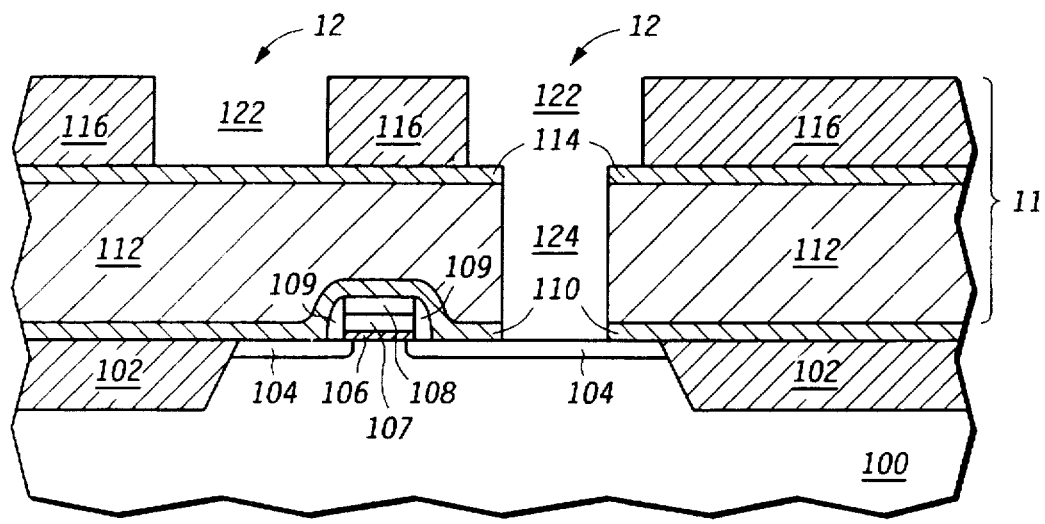
FIG. 1 includes an illustration of a cross-sectional view of a portion of a semiconductor device substrate after forming interconnect trenches and contact openings.

FIG. 1 includes a portion of a semiconductor device substrate 100, field isolation regions 102, and doped regions 104. As used in the specification, the semiconductor device substrate 100 includes a monocrystalline semiconductor wafer, a semiconductor-on-insulator wafer or any other substrate used in forming semiconductor devices. A gate dielectric layer 106 is formed over the substrate 100 followed by a silicon film 107 and a silicide film 108. The silicide film 108 and silicon film 107 are patterned to form a gate electrode as illustrated in FIG. 1. Sidewall spacers 109 are formed adjacent to the gate electrode that includes the silicon film 107 and the silicide film 108. Although not shown, silicide regions may overlie the doped regions 104.

A first interlevel dielectric layer 11 overlies the substrate 100 and gate electrode. The first ILD layer 11 includes a first etch-stop film 110, a first planarized insulating film 112, a second etch-stop film 114, and a second planarization insulating film 116. All the films 110 through 116 typically are insulators. In one particular embodiment, the etch-stop films include nitride films, such as silicon nitride, and the planarized insulating films 112 and 116 include oxides. Although not shown, an antireflective film including silicon rich silicon oxynitride could be formed as part of the ILD layer 11 and would be formed over the second planarized insulating film 116 but is not shown. The first ILD layer 11 is then patterned to form openings 12, which include interconnect trench portions 122 and contact portions 124. The interconnect trench portions 122 are formed within layer or film 116 and are generally wider than the contact portions 124, which extend through the first and second etch-stop films 110 and 114 and the first planarized insulating film 112. The structure up to this point in time is formed using conventional methods.

Figure 2:
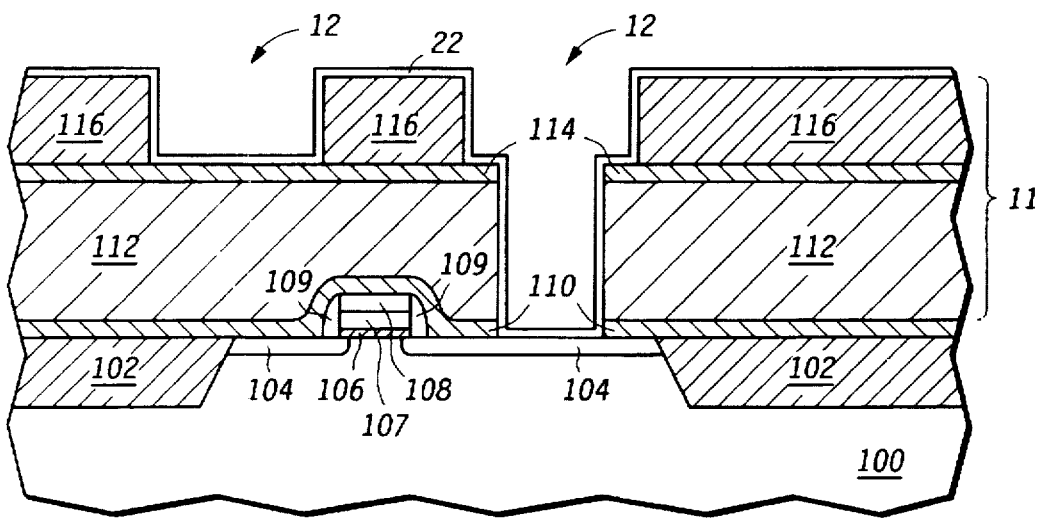
FIG. 2 includes an illustration of a cross-sectional view of the substrate of FIG. 1 after forming a tantalum nitride film.
Figure 3:
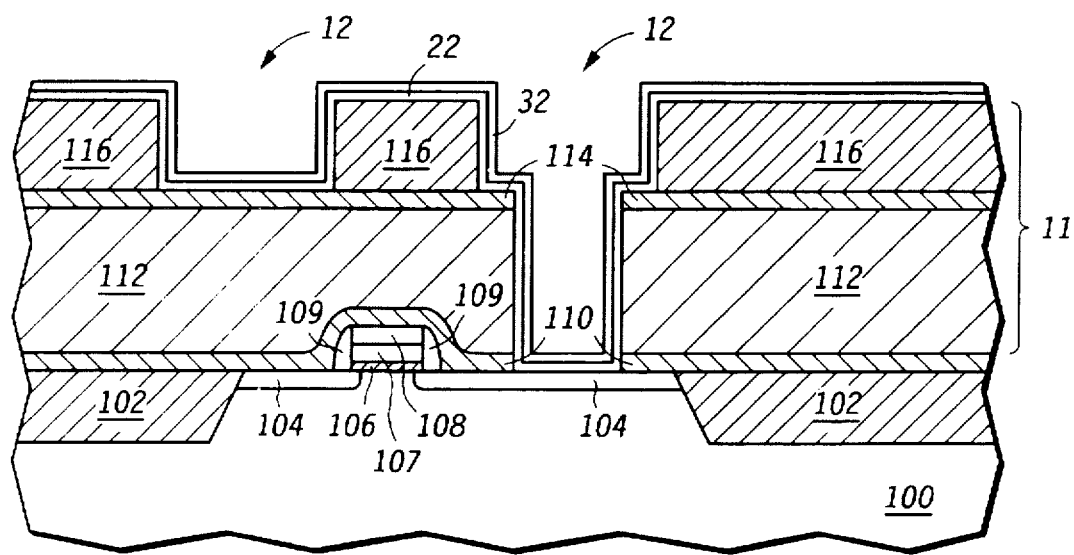
FIG. 3 includes an illustration of a cross-sectional view of the substrate of FIG. 2 after forming a tantalum-rich tantalum nitride film.

A tantalum nitride film 22 is then deposited over the substrate and within the openings 12. The tantalum nitride film 22 typically includes 33 to 50 atomic percent nitrogen with the balance essentially being tantalum. This layer is formed and can contact the doped regions 104 as illustrated in FIG. 2. The substrate is then further processed to form a tantalum-rich tantalum nitride film 32 that overlies the tantalum nitride film 22 as shown in FIG. 3. The combination of the films 22 and 32 are a first conductive film that is an adhesion/barrier film for the wirings being formed. The first conductive film is in a range of approximately 10 to 500 angstroms, and typically is in a range of approximately 100 to 300 angstroms.

The formation of the tantalum nitride and tantalum-rich tantalum nitride films 22 and 32 are formed as follows. The substrate is placed on a susceptor within a processing chamber, such as a deposition apparatus. The susceptor is heated to a temperature in a range of approximately 50 to 250° C. The pressure during the deposition of the two films is generally in a range of approximately 15 to 40 millitorr. The pressure is dependent on the aspect ratio and geometry of the structure being deposited. The direct current (DC) power used to sputter material is usually in a range of 0.5 to 3 kilowatts, and more specifically, is typically in a range of 1.2 to 1.8 kilowatts. The radio frequency (RF) power used to create a plasma within the sputtering chamber is usually in the range of 1 to 2 kilowatts, and more specifically, is typically 1.3 to 1.7 kilowatts.

The deposition of the two films 22 and 32 is typically performed as one sequence during a single evacuation cycle. During the first portion of the deposition, where the tantalum nitride film 22 is close to the stoichiometric composition (TaN), there is no biasing of the substrate. During this time, a nitrogen-containing gas and an inert gas, such as argon, are directed toward a sputtering target. The nitrogen-containing gas includes nitrogen, ammonia or the like. In forming film 32, the nitrogen-containing gas is terminated while the inert gas continues to flow, and the substrate becomes biased at approximately negative 75 to negative 80 volts.

Figure 4:
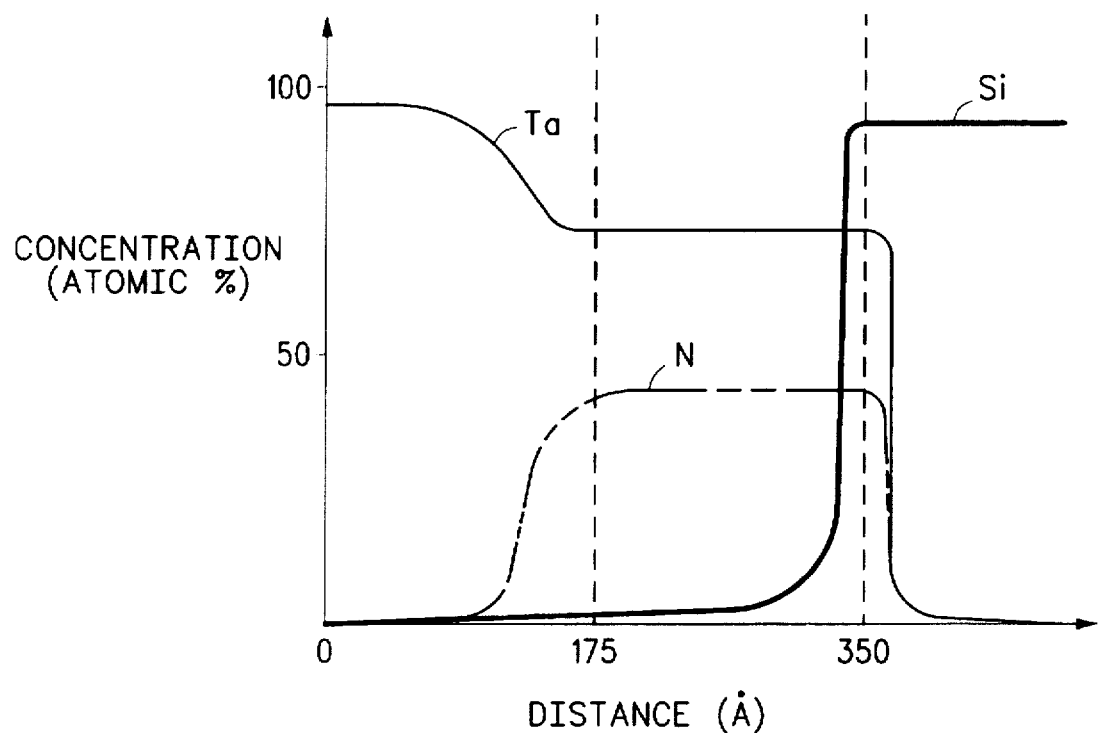
FIG. 4 includes an illustration of a plot illustrating the change in concentration of various elements with depth from the substrate surface after forming the tantalum-rich tantalum nitride film.

During this sputter deposition, the atomic percent of tantalum within the layer increases while the atomic percent of the nitrogen decreases as illustrated in FIG. 4. FIG. 4 includes a plot of concentration (in atomic percent) as a function of the distance from the exposed surface to the first ILD layer 11. The tantalum-rich tantalum nitride film has a range of approximately 0–30 atomic percent nitrogen. In this particular embodiment, the upper surface of the tantalum-rich tantalum nitride film is substantially pure tantalum and has essentially no nitrogen atoms. A lower atomic percent nitrogen at the upper surface typically gives better adhesion to copper films. At the upper surface, the atomic percent tantalum may be at least 95% and the atomic percent nitrogen may be less than 5% if copper adhesion is particularly problematic. In an alternate embodiment, the nitrogen-containing and inert gases can be terminated and the chamber evacuated before flowing just the inert gas. A first conductive film with discrete portions will be formed, unlike a previous embodiment that does not evacuate between the steps of forming the films 22 and 32.

In one particular embodiment, the time period when the nitrogen-containing gas flows and biasing is off (film 22) is approximately equal to the time period when the nitrogen-containing gas flow is terminated and the biasing is on (film 32). However, time periods may be different. In some embodiments, the tantalum nitride film 22 is thicker than the tantalum-rich tantalum nitride film 32. The combined thickness of the two films 32 and 22 is in a range of approximately 10 to 500 angstroms, and typically is in a range of approximately 100 to 300 angstroms.

Figure 5:
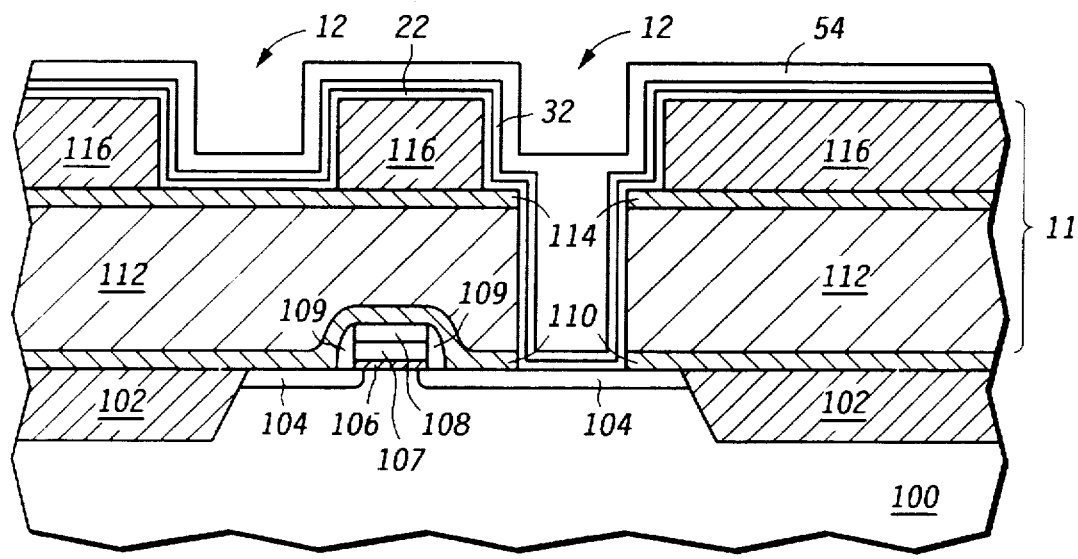
FIG. 5 includes an illustration of a cross-sectional view of the substrate of FIG. 3 after forming a copper seed film.
Figure 6:
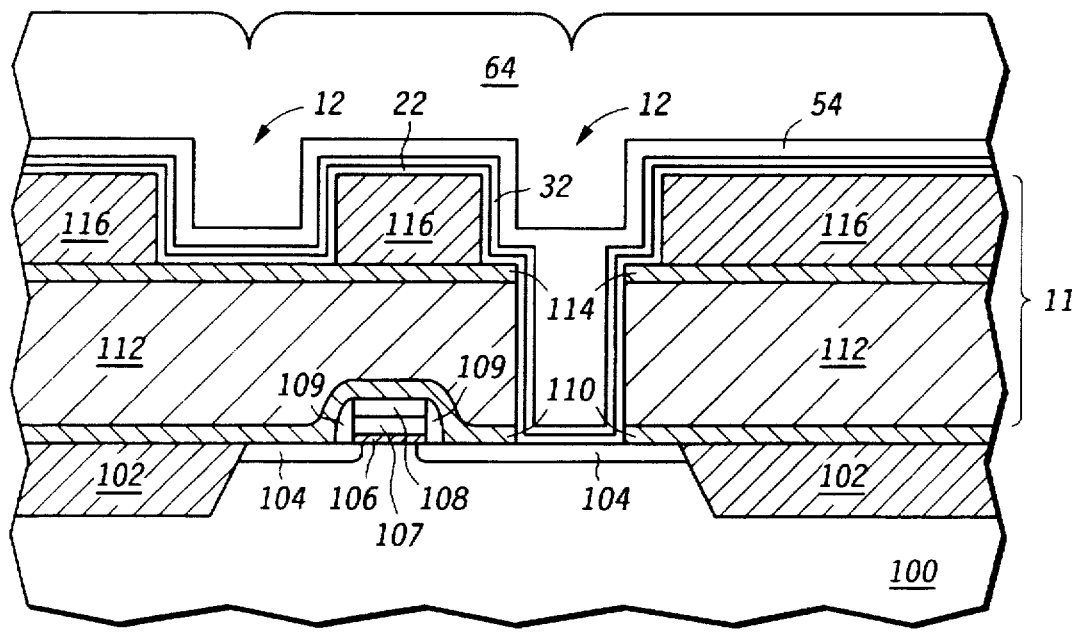
FIG. 6 includes an illustration of a cross-sectional view of the substrate of FIG. 5 after electroplating a copper film over the copper seed film.

A copper seed film 54 is then deposited over the tantalum-rich tantalum nitride film 32 as shown in FIG. 5. The copper seed film 54 can be deposited by a number of methods including physical vapor deposition, chemical vapor deposition, or the like. If metal-organic chemical vapor deposition used, the copper precursor can be any one or more of the following: copper hexafluoroacetyl vinyltrimethylsilane (Cu(hfac)(VTMS)); copper hexafluoroacetyl 3-hexyne (Cu(hfac)(3-hexyne)); or the like. Additionally copper (II) β-diketonate compounds could be used. After the copper seed film 54 has been deposited, an electroplated copper film 64 is then formed over all the substrate as shown in FIG. 6. The thickness of the electroplated copper film 64 is sufficiently thick to fill the interconnect trench portions of the openings 12. The combination of the films 54 and 64 are a second conductive film, which is mostly copper, for the wirings being formed.

Figure 7:
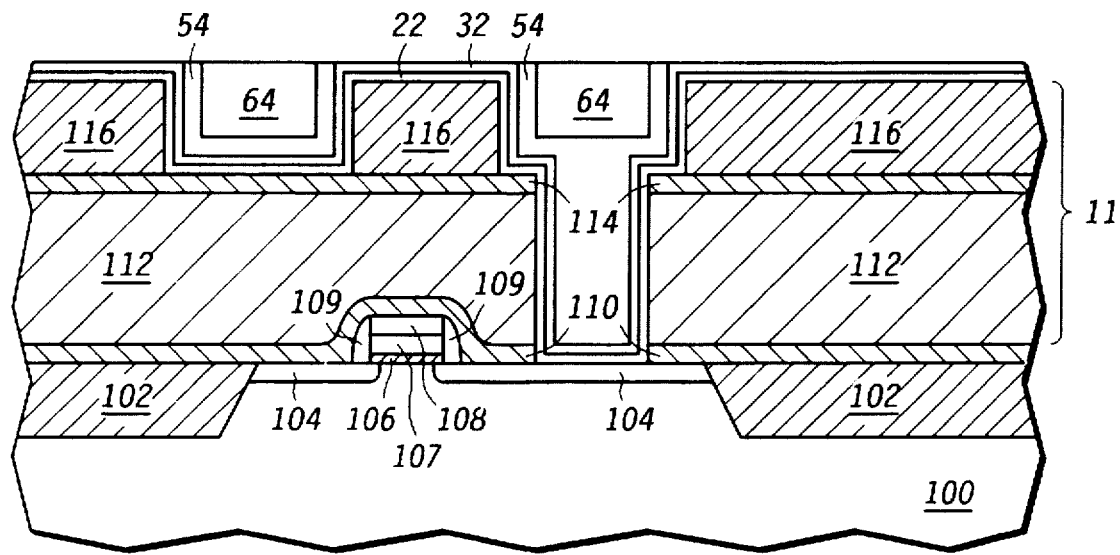
FIG. 7 includes an illustration of a cross-sectional view of the substrate of FIG. 6 after polishing the substrate to remove those portions of the copper films that overlie the tantalum-rich tantalum nitride film outside interconnect trenches and contacts.
Figure 8:
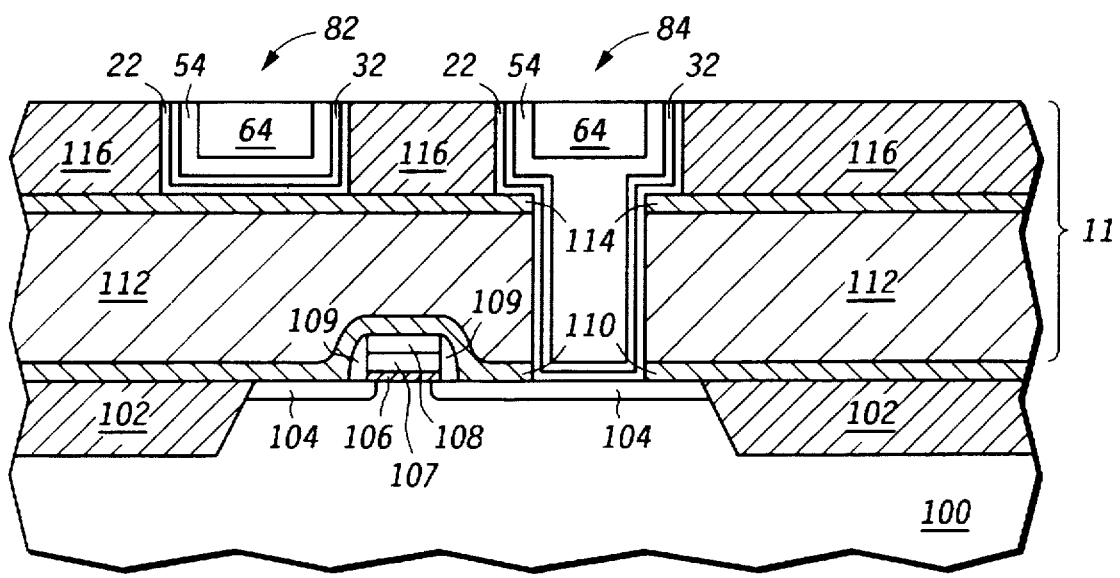
FIG. 8 includes an illustration of a cross-sectional view of the substrate of FIG. 7 after polishing the tantalum-rich tantalum nitride and tantalum nitride films to form wirings for the semiconductor device.

A first chemical-mechanical polishing step is performed to remove all of the copper films 54 and 64 that overlie the tantalum-rich tantalum nitride film 32 as shown in FIG. 7. The first conductive film (films 22 and 32) is a polish-stop when polishing the second conductive film (films 54 and 64). A second polishing step is performed to remove the tantalum-rich tantalum nitride film 32 and the tantalum nitride film 22 overlying the second planarized insulating film 116 outside the openings 12 as shown in FIG. 8. At this point in the process, interconnect wirings 82 and 84 are formed as shown in FIG. 8. Wiring 84 includes an interconnect portion and a contact portion that contacts one of the doped regions 104. Electrical connections using contacts are made to the interconnect 82 but are not illustrated in FIG. 8.

Figure 9:
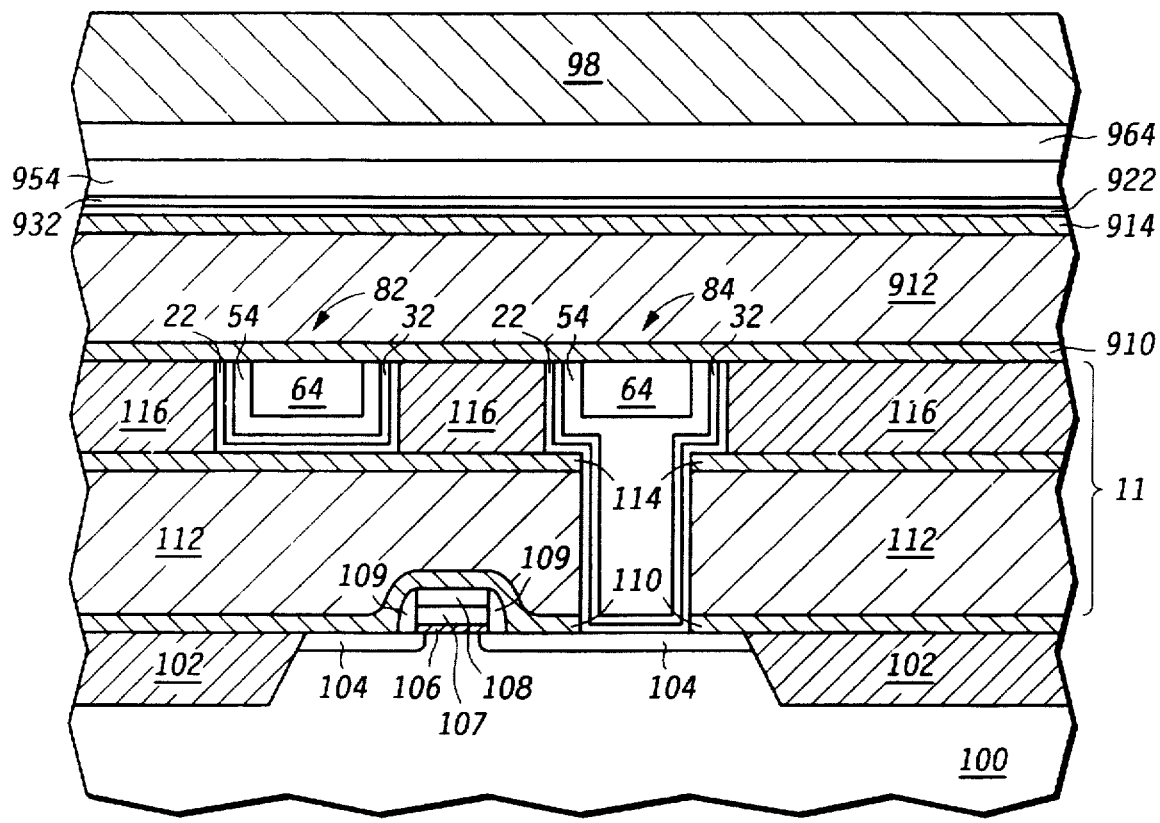
FIG. 9 includes an illustration of a cross-sectional view of a substantially completed semiconductor device.

Processing continues to form a substantially completed device as illustrated in FIG. 9. At this point a third etch-stop film 910 is formed over the wirings 82 and 84, a third planarized insulating film 912 is formed over the third etch-stop film 910 and a fourth etch-stop film 914 is formed over the third planarized insulating film 912. Although not shown, a fourth planarized insulating film is also formed. The films making up the second ILD layer that includes films 910, 912 and 914 is patterned to form interconnect trenches and contact openings where required using a conventional process. Although not shown in FIG. 9, the openings are formed that extend through the films 910, 912 and 914.

After forming the opening, a tantalum nitride film 922 is deposited followed by tantalum-rich tantalum nitride film 932 followed by a copper seed film 954 and an electroplated copper film 964. After performing the appropriate polishing steps, a passivation layer 98 is then formed to form the substantially completed device. Although not shown, additional interlevel dielectric layers, wiring layers, and other electrical connections can be made but are not illustrated in FIG. 9.

Other alternatives to the present invention could be used. In addition to using tantalum, other refractory metals could be used in forming the barrier/adhesion film. The tantalum can be replaced by another refractory metal, such as tungsten, molybdenum, or the like. In still other embodiments, semiconductor atoms can be incorporated in either or both of the films 32 and 22. For example, tantalum silicon nitride and tantalum-rich tantalum silicon nitride could be formed. Alternatively, germanium atoms or both silicon and germanium atoms can be present. In forming a refractory metal-semiconductor-nitrogen compound, typically a target used for sputtering includes the refractory metal and semiconductor atoms.

In one specific environment, tantalum silicide can be used and tantalum silicon nitride can be formed by sputtering the tantalum silicide target with a combination of argon and nitrogen gases. The tantalum-rich tantalum silicon nitride film can be formed similar to the tantalum-rich tantalum nitride film wherein the nitrogen gas is terminated and the argon layer is directed toward the target to remove the remaining tantalum silicon nitride skin left on the target surface from the prior sputtering.

In yet another embodiment, a substantially pure tantalum film, a tantalum-rich tantalum nitride film, or a tantalum silicon nitride film can be formed before forming the tantalum nitride film 22. In one embodiment, a tantalum target can be sputtered for a short period of time to form an initial tantalum film followed by a tantalum nitride film and a tantalum-rich tantalum nitride film. This embodiment may allow better contacts to be formed to substrates and silicides because the tantalum film may react with native oxide present on those surfaces.

In other structures, a single inlaid wirings can be formed. In this particular case, the thickness of the tantalum nitride film 22 and tantalum-rich tantalum nitride film 32 can be increased compared to the dual inlaid structure as illustrated in FIGS. 1–9.

In still another embodiment, the combination of the copper seed film 54 and the electroplated copper film 64 can be replaced by a single copper film formed by chemical vapor deposition or physical vapor deposition. When forming this film, the substrate can be heated such that copper can flow into the openings as required. In this case, the substrate or susceptor temperature is typically in a range of approximately 350–450° C. Care should be exercised as the integrity of the tantalum nitride barrier film may be jeopardized if the temperature is taken too high. The temperature during the deposition is high enough to allow the copper to flow but not so that the integrity of the tantalum nitride barrier film is jeopardized. These copper-flowing embodiments achieve benefits, such as reducing polishing time and dishing.

Embodiments of the present invention do offer benefits that are not seen with prior art methods. The tantalum nitride film is a good barrier, but the use of tantalum-rich tantalum nitride in conjunction with the tantalum nitride allows for a better adhesion, particularly in the case of chemical vapor deposited copper films. The inventors believe that if the nitrogen content in the film 32 is too high, a cyanide compound may be formed that adversely affects the adhesion. By keeping the nitrogen concentration at the surface that contacts copper relatively low, better adhesion can be achieved.

A further benefit is that the improved adhesion should also achieve better contact resistance. Further, embodiments of the present invention reduce the effects of electromigration. Still another benefit is that embodiments can use presently existing equipment without the use of exotic materials or having to develop marginal processes.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising the steps of:

placing a substrate in a processing chamber;

forming a first conductive film that includes a refractory metal and nitrogen over the substrate, wherein:
   the first conductive film includes a first portion and a second portion;
   the first portion lies closer to the substrate and has a first nitrogen atomic percentage;
   the second portion lies further from the substrate has a second nitrogen atomic percentage that is lower than the first nitrogen atomic percentage; and
   a change between the first nitrogen atomic percent and the second atomic percent within the first conductive film is essentially continuous; and forming a second conductive film over the first conductive film, wherein the second conductive film includes mostly copper.

2. The process of claim 1, wherein the first nitrogen atomic percentage is in a range of approximately 33–50 atomic percent nitrogen.

3. The process of claim 1, wherein the second nitrogen atomic percentage is in a range of approximately 0–30 atomic percent nitrogen.

4. The process of claim 1, wherein the refractory metal is selected from a group consisting of tantalum, tungsten, and molybdenum.

5. The process of claim 1, wherein the second portion further comprises semiconductor atoms.

6. The process of claim 1, wherein the first conductive film includes an uppermost surface that is furthest from the substrate, and, wherein the first conductive film at the uppermost surface has essentially no nitrogen atoms.

7. The process of claim 1, wherein the step of forming the first conductive film is performed in the processing chamber and includes steps of:

depositing the first portion while a nitrogen-containing gas flows into the processing chamber; and depositing the second portion on the first portion, wherein the nitrogen-containing gas has a lower flowrate compared to the step of depositing the first portion.

8. The process of claim 7, further comprising a step of depositing a third portion of the first conductive film before the step of depositing the first portion.

9. The process of claim 7, wherein the nitrogen-containing gas is reduced to zero flow during the step of depositing the second portion.

10. The process of claim 7, wherein the first portion is thicker than the second portion.

11. The process of claim 1, wherein the first conductive film has a thickness in a range of approximately 10 to 500 angstroms.

12. The process of claim 1, wherein the step of forming the second conductive film includes a step of depositing at least a portion of the second conductive film by metal-organic chemical vapor deposition.

13. The process of claim 1, wherein the step of forming the second conductive film includes a step of depositing at least a portion of the second conductive film using physical vapor deposition, wherein:

the substrate is placed on a susceptor; and at least one of the substrate and the susceptor is at a temperature in a range of approximately 350–450° C. during the step of depositing.

14. The process of claim 1, further comprising a step of forming a passivation layer over the first and second conductive films.

15. The process of claim 5, wherein the second portion comprises semiconductor atoms selected from a group consisting silicon and germanium.

16. The process of claim 1, further comprising forming an insulating layer prior to forming the first conductive film, wherein the first portion contacts the insulating layer.

17. The process of claim 16, wherein the first portion consists essentially of tantalum and nitrogen, and wherein the first nitrogen atomic percent is in a range of approximately 33–50 atomic percent.

18. A process for forming a semiconductor device comprising the steps of:

forming a patterned insulating layer over a substrate, wherein the patterned insulating layer includes an opening;

forming a first conductive film that includes tantalum and nitrogen, wherein:

the first conductive film includes a first portion and a second portion;

the first portion lies closer to the substrate and has a first nitrogen atomic percentage; and the second portion lies further from the substrate and has a second nitrogen atomic percentage that is lower than the first nitrogen atomic percentage; and forming a second conductive film on the first conductive film, wherein the second conductive film includes mostly copper;

polishing the second conductive film to remove the second conductive film overlying the patterned insulating layer outside of the opening; and polishing the first conductive film to remove the first conductive film overlying the patterned insulating layer outside of the opening.

19. The process of claim 18, wherein the step of forming the second conductive film includes a step of depositing at least a portion of the second conductive film by metal-organic chemical vapor deposition onto the second portion of the first conductive film.

20. The process of claim 18, wherein the second portion further comprises semiconductor atoms selected from a group consisting silicon and germanium.

21. The process of claim 18, wherein the first portion contacts the patterned insulating layer.

22. The process of claim 21, wherein the first nitrogen atomic percent is in a range of approximately 33–50 atomic percent.

* * * * *